(12) United States Patent
Aoki et al.

(10) Patent No.: US 12,441,856 B2
(45) Date of Patent: Oct. 14, 2025

(54) RESIN SHEET, PREPREG, INSULATING RESIN MEMBER, AND PRINTED WIRING BOARD

(71) Applicant: Panasonic Intellectual Property Management Co., Ltd., Osaka (JP)

(72) Inventors: Tomoyuki Aoki, Fukushima (JP); Akihiro Yamauchi, Osaka (JP); Eiichiro Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 310 days.

(21) Appl. No.: 18/012,583

(22) PCT Filed: Jul. 7, 2021

(86) PCT No.: PCT/JP2021/025679
§ 371 (c)(1),
(2) Date: Dec. 22, 2022

(87) PCT Pub. No.: WO2022/009937
PCT Pub. Date: Jan. 13, 2022

(65) Prior Publication Data
US 2023/0257540 A1    Aug. 17, 2023

(30) Foreign Application Priority Data
Jul. 8, 2020 (JP) .................................. 2020-118010

(51) Int. Cl.
*H05K 1/03*   (2006.01)
*B29B 11/16*  (2006.01)
(Continued)

(52) U.S. Cl.
CPC ............. *C08J 5/244* (2021.05); *B29B 11/16* (2013.01); *C08J 5/18* (2013.01); *H05K 1/0366* (2013.01);
(Continued)

(58) Field of Classification Search
CPC ... H05K 1/02; H05K 1/03; H05K 3/46; B29B 11/16; B29K 105/06; B32B 27/00;
(Continued)

(56) References Cited

U.S. PATENT DOCUMENTS 5,389,487 A * 2/1995 Kawakami ......... G03G 9/08797
430/123.54
5,599,895 A * 2/1997 Heider ............... C08G 18/4018
528/80
(Continued)

FOREIGN PATENT DOCUMENTS

JP    09-186457    7/1997
JP    11-279493    10/1999
(Continued)

OTHER PUBLICATIONS

Official Communication issued in International Patent Application No. PCT/JP2021/025679, dated Sep. 21, 2021, along with an English translation thereof.

*Primary Examiner* — Dameon E Levi
(74) *Attorney, Agent, or Firm* — GREENBLUM & BERNSTEIN, P.L.C.

(57) ABSTRACT

A resin sheet according to the present disclosure includes an uncured product or semi-cured product of a thermosetting resin composition. A melt viscosity of the resin sheet is equal to or greater than 10 Pa·s and equal to or less than 2000 Pa·s when measured using a Koka flow tester under a measuring condition including 130° C. and 1 MPa and is equal to or greater than 6 Pa·s and equal to or less than 1200 Pa·s when
(Continued)

measured using the Koka flow tester under a measuring condition including 130° C. and 4 MPa.

6 Claims, 2 Drawing Sheets

(51) Int. Cl.
*C08J 5/18* (2006.01)
*C08J 5/24* (2006.01)
*H05K 1/18* (2006.01)
*B29K 101/10* (2006.01)
*B29K 105/00* (2006.01)

(52) U.S. Cl.
CPC .......... H05K 1/182 (2013.01); *B29K 2101/10* (2013.01); *B29K 2105/0094* (2013.01); *C08J 2363/00* (2013.01); *C08J 2463/00* (2013.01)

(58) Field of Classification Search
CPC ......... B32B 27/06; B32B 27/08; B32B 27/10; B32B 27/30; B32B 27/32; B32B 27/36; B32B 27/40; B32B 27/203; B32B 27/283; B32B 27/306; B32B 27/325; C08J 5/18; C09D 5/03; H01L 23/29; H01L 23/36; H01L 23/3735; H01L 23/3736; H01L 23/3737
USPC .... 361/761; 523/46, 76, 218, 500, 513, 527; 524/77, 88, 115, 400; 525/46, 107, 123, 525/421, 440.12; 528/67, 49, 59, 80, 480
See application file for complete search history.

(56) References Cited

U.S. PATENT DOCUMENTS

| | | | | |
|---|---|---|---|---|
| 5,817,384 A * | 10/1998 | Furuta | ...................... | B32B 27/10 206/524.1 |
| 6,339,115 B1 * | 1/2002 | Aoki | ...................... | C08L 77/12 525/46 |
| 6,432,552 B1 * | 8/2002 | Onishi | ...................... | B32B 27/306 524/400 |
| 7,662,907 B2 * | 2/2010 | Hwang | ...................... | C08G 63/80 252/299.01 |
| 8,835,773 B2 * | 9/2014 | Muramatsu | ......... | H01L 23/3121 361/753 |
| 2002/0128356 A1 * | 9/2002 | Nakamura | ...................... | B01J 2/02 523/160 |
| 2003/0045613 A1 * | 3/2003 | Ohnishi | ...................... | C09D 5/03 525/107 |
| 2007/0213465 A1 * | 9/2007 | Brand | ...................... | C08G 18/10 525/123 |
| 2008/0146770 A1 * | 6/2008 | Hwang | ................ | C08G 63/605 528/308 |
| 2010/0208440 A1 * | 8/2010 | Peiffer | ...................... | H05K 1/162 29/610.1 |
| 2012/0106108 A1 * | 5/2012 | Ito | ........................ | H01L 23/5385 361/761 |
| 2015/0228948 A1 * | 8/2015 | Maruyama | .......... | H01M 50/489 521/134 |
| 2016/0017141 A1 | 1/2016 | Matsumoto et al. | | |
| 2017/0029548 A1 * | 2/2017 | Kawai | ........................ | C09J 4/06 |
| 2017/0292046 A1 * | 10/2017 | Fukuda | ................. | B32B 27/325 |
| 2018/0142055 A1 * | 5/2018 | Masuda | .............. | C08F 290/046 |
| 2018/0312683 A1 * | 11/2018 | Umehara | .............. | C08F 222/10 |
| 2020/0275581 A1 * | 8/2020 | Sawaguchi | ......... | H01L 23/3735 |
| 2020/0277489 A1 * | 9/2020 | Kakutaka | ............. | C09D 177/00 |
| 2023/0120541 A1 * | 4/2023 | Usui | ..................... | B32B 15/092 428/164 |
| 2024/0263003 A1 * | 8/2024 | Nishiguchi | ............. | C08L 65/00 |

FOREIGN PATENT DOCUMENTS

| | | |
|---|---|---|
| JP | 2000-095844 | 4/2000 |
| JP | 2003-037362 | 2/2003 |
| JP | 2003-253125 | 9/2003 |
| JP | 2004-059896 | 2/2004 |
| JP | 2006-066738 | 3/2006 |
| JP | 2020-098838 | 6/2020 |
| WO | 2014/132654 | 9/2014 |

* cited by examiner

RESIN SHEET, PREPREG, INSULATING RESIN MEMBER, AND PRINTED WIRING BOARD

CROSS-REFERENCE TO RELATED APPLICATIONS

This application is a National Stage of International Application No. PCT/JP2021/025679 filed Jul. 7, 2021, which claims priority to Japanese Patent Application No. 2020-118010 filed Jul. 8, 2020, the contents of each of the above-identified applications are incorporated herein by reference in their entirety.

TECHNICAL FIELD

The present disclosure generally relates to a resin sheet, a prepreg, an insulating resin member, and a printed wiring board. More particularly, the present disclosure relates to a resin sheet and prepreg which may be used to form an insulating layer of a printed wiring board, an insulating resin member including the resin sheet and the prepreg, and a printed wiring board including an insulating layer formed out of the resin sheet and the prepreg.

BACKGROUND ART

Patent Literature 1 teaches manufacturing a multilayer printed wiring board by forming a laminate with a resin sheet, which is thermally meltable and has thermosetting properties, interposed between an exposed surface of via holes of a board and a prepreg containing an inorganic filler.

CITATION LIST

Patent Literature

Patent Literature 1: JP 2003-37362 A

SUMMARY OF INVENTION

The problem to be overcome by the present disclosure is to provide: a resin sheet and prepreg which may be used to form an insulating layer in which a conductor is embedded, makes it easier to embed the conductor in the insulating layer, and reduces the chances of causing a decline in moldability; an insulating resin member including the resin sheet and the prepreg; and a printed wiring board including an insulating layer formed out of the resin sheet and the prepreg.

A resin sheet according to an aspect of the present disclosure includes an uncured product or semi-cured product of a thermosetting resin composition (X1). A melt viscosity of the resin sheet is equal to or greater than 10 Pa·s and equal to or less than 2000 Pa·s when measured using a Koka flow tester under a measuring condition including 130° C. and 1 MPa and is equal to or greater than 6 Pa·s and equal to or less than 1200 Pa·s when measured using the Koka flow tester under a measuring condition including 130° C. and 4 MPa.

A prepreg according to another aspect of the present disclosure is used along with the resin sheet described above and includes: a base member; and an uncured product or semi-cured product of a thermosetting resin composition (X2) impregnated into the base member. A melt viscosity of the uncured product or semi-cured product of the thermosetting resin composition (X2) is equal to or greater than 500 Pa·s and equal to or less than 6000 Pa·s when measured using the Koka flow tester under the measuring condition including 130° C. and 4 MPa.

An insulating resin member according to still another aspect of the present disclosure includes: the resin sheet described above; and the prepreg stacked on the resin sheet.

A printed wiring board according to yet another aspect of the present disclosure includes: a core member including an insulating substrate and a conductor laid on top of the insulating substrate; and an insulating layer stacked on the core member and covering the conductor. The insulating layer includes: a first layer which is arranged in contact with the core member and is a cured product of the resin sheet described above; and a second layer which is stacked on the first layer and is a cured product of the prepreg described above.

DESCRIPTION OF EMBODIMENTS

Figure 1:
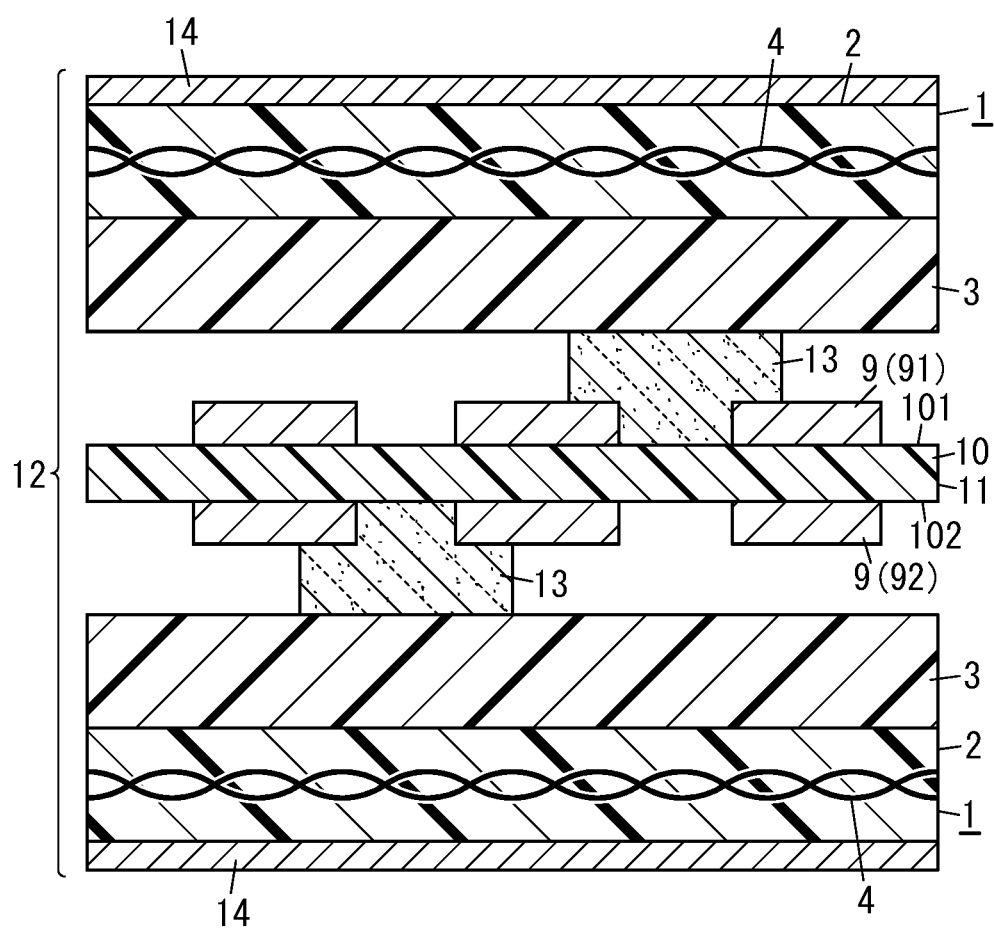
FIG. 1 is a schematic cross-sectional view of prepregs, resin sheets, and a core member and a laminate made up of the prepregs, the resin sheets, and the core member according to an exemplary embodiment of the present disclosure.

The present inventors discovered that in a situation where a printed wiring board was formed by stacking a resin sheet and a prepreg one on top of the other and integrating the resin sheet and the prepreg with each other on the conductor and thereby forming, over the conductor, an insulating layer out of a cured product of the resin sheet and the prepreg and by embedding the conductor in the cured product of the resin sheet, if the conductor was rather thick, it was difficult to sufficiently embed the conductor in the cured product of the resin sheet. Alternatively, even if the conductor could be embedded sufficiently in the cured product of the resin sheet, moldability tended to decline when the insulating layer was molded out of the resin sheet and the prepreg.

Thus, the present inventors carried out research and development to provide a resin sheet which may be used to form the insulating layer in which the conductor is embedded, makes it easier to embed the conductor in the insulating layer, and reduces the chances of causing a decline in moldability, thus conceiving the concept of the present disclosure.

An exemplary embodiment of the present disclosure will now be described. Note that the embodiment to be described below is only an exemplary one of various embodiments of the present disclosure and should not be construed as limiting. Rather, the exemplary embodiment may be readily modified in various manners depending on a design choice or any other factor without departing from the scope of the present disclosure.

A resin sheet 3 according to this embodiment includes an uncured product or semi-cured product of a thermosetting resin composition (X1) (hereinafter simply referred to as "composition (X1)"). A melt viscosity of the resin sheet is equal to or greater than 10 Pa·s and equal to or less than 2000 Pa·s when measured using a Koka flow tester under a measuring condition including 130° C. and 1 MPa and is equal to or greater than 6 Pa·s and equal to or less than 1200 Pa·s when measured using a Koka flow tester under a measuring condition including 130° C. and 4 MPa. Note that the uncured product may be the composition (X1) itself. Alternatively, if the composition (X) contains a solvent, the uncured product may also be a product produced by vaporizing the solvent from the composition (X1) without allowing the curing reaction of the composition (X1) to advance. Meanwhile, the semi-cured product as used herein refers to a product produced by partially curing the composition (X1) and corresponds to a product in a so-called "Stage B" state.

An insulating layer 8 in which the conductor 9 is embedded may be formed out of this resin sheet 3. This enables using the resin sheet 3 to form the insulating layer 8 of a printed wiring board 5, for example. According to this embodiment, forming the insulating layer 8 in which the conductor 9 is embedded out of the resin sheet 3 makes it easier to embed the conductor 9 in the insulating layer 8 and reduces the chances of causing a decline in moldability.

A prepreg 2 according to this embodiment is used to be stacked on the resin sheet 3. The prepreg 2 includes: a base member 4; and an uncured product or semi-cured product of a thermosetting resin composition (X2) (hereinafter simply referred to as "composition (X2)") impregnated into the base member 4. A melt viscosity of the uncured product or semi-cured product of the composition (X2) is equal to or greater than 500 Pa·s and equal to or less than 6000 Pa·s when measured using a Koka flow tester under a measuring condition including 130° C. and 4 MPa. Note that the uncured product may be the composition (X2) itself. Alternatively, if the composition (X2) contains a solvent, the uncured product may also be a product produced by vaporizing the solvent from the composition (X2) without allowing the curing reaction of the composition (X2) to advance. Meanwhile, the semi-cured product as used herein refers to a product produced by partially curing the composition (X2) and corresponds to a product in a so-called "Stage B" state.

An insulating layer 8 in which the conductor 9 is embedded may be formed out of this prepreg 2 and the resin sheet 3. This enables using the prepreg 2 and the resin sheet 3 to form the insulating layer 8 of a printed wiring board 5, for example. According to this embodiment, forming the insulating layer 8 in which the conductor 9 is embedded out of the prepreg 2 and the resin sheet 3 makes it much easier to embed the conductor 9 in the insulating layer 8 and significantly reduces the chances of causing a decline in moldability.

Next, it will be described with reference to FIGS. 1 and 2 how to form the insulating layer 8 and how to manufacture the printed wiring board 5.

Figure 2:
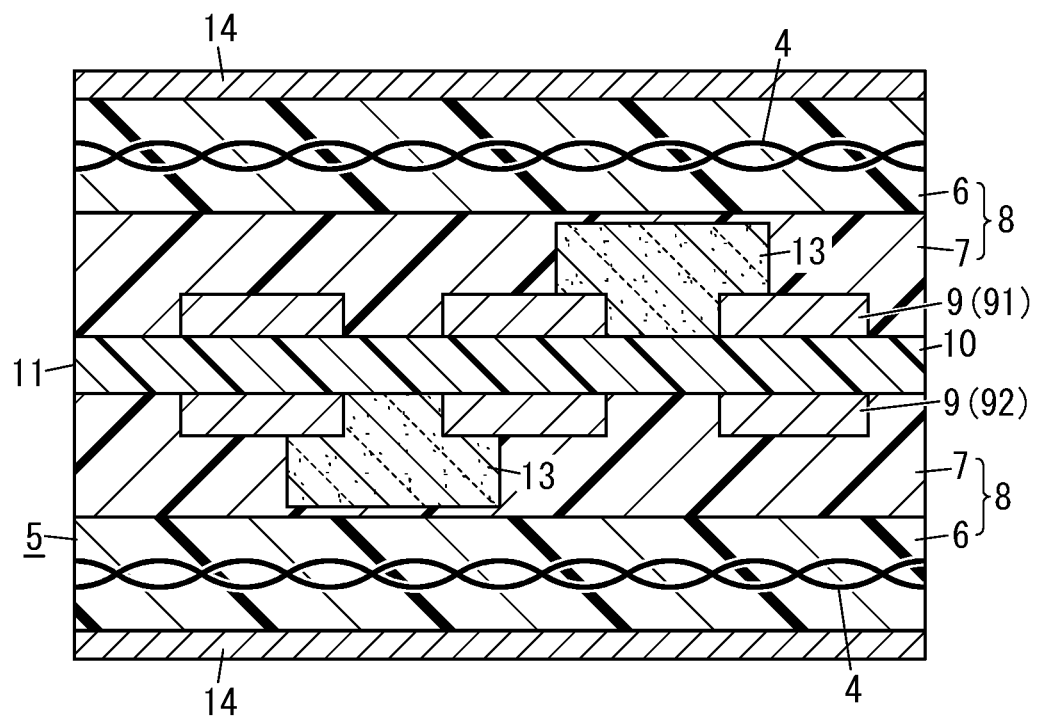
FIG. 2 is a schematic cross-sectional view of a printed wiring board according to the exemplary embodiment of the present disclosure.

To form the insulating layer 8 out of the prepreg 2 and the resin sheet 3, specifically, a core member 11 including a conductor 9 such as conductor wiring is provided as shown in FIG. 1, for example. The core member 11 includes, for example, an insulating substrate 10 and a conductor 9 laid on top of the insulating substrate 10. Any materials may be used for the insulating substrate 10 and the conductor 9 as long as the materials may be used as materials for a printed wiring board. The insulating substrate 10 may be, for example, a resin substrate such as an epoxy resin substrate including a glass base member. The conductor 9 may be copper wiring formed by, for example, additive process or subtractive process.

In the example illustrated in FIG. 1, the core member 11 includes, as the conductor 9, a first conductor 91 laid on top of one surface (first surface 101) of the insulating substrate 10 and a second conductor 92 laid on top of a second surface 102 opposite from the first surface 101 of the insulating substrate 10.

Electronic components 13 may be mounted on each surface, having the conductor 9, of the core member 11. The electronic components 13 may be, but do not have to be, ICs and LSIs.

As shown in FIG. 1, the core member 11, the resin sheet 3, and the prepreg 2 are stacked one on top of another in this order such that the conductor 9 faces the resin sheet 3, thereby forming a laminate 12. Optionally, the laminate 12 may further include a sheet of metal foil 14 as shown in FIG. 1. In that case, the core member 11, the resin sheet 3, the prepreg 2, and the sheet of metal foil 14 are stacked one on top of another in this order such that the conductor 9 faces the resin sheet 3, thereby forming a laminate 12 as shown in FIG. 1. The sheet of metal foil 14 may be, but does not have to be, a sheet of copper foil.

In the example shown in FIG. 1, one resin sheet 3, one prepreg 2, and one sheet of metal foil 14 are stacked one on top of another in this order over the first conductor 91 of the core member 11 and another resin sheet 3, another prepreg 2, and another sheet of metal foil 14 are also stacked one on top of another in this order over the second conductor 92 of the core member 11. That is to say, the one sheet of metal foil 14, the one prepreg 2, the one resin sheet 3, the core member 11, the other resin sheet 3, the other prepreg 2, and the other sheet of metal foil 14 are stacked one on top of another in this order. Alternatively, the resin sheet 3 and the prepreg 2 may be stacked on only one side of the core member 11.

Next, hot-press the laminate 12, and the resin sheet 3 either softens or melts and comes to have a decreased viscosity to start flowing following the shape of the conductor 9. If the electronic components 13 are mounted on the core member 11, then the resin sheet 3 flows following the shape of the electronic components 13 as well. In this manner, the conductor 9 is embedded in the resin sheet 3. If the electronic components 13 are mounted on the core member 11, then the electronic components 13 are also embedded in the resin sheet 3. Subsequently, the resin sheet 3 cures. As a result, a first layer 7 is formed as a cured product of the resin sheet 3 and the conductor 9 is embedded in the first layer 7. If the electronic components 13 are mounted on the core member 11, then the electronic components 13 are also embedded in the first layer 7.

In the same way, the prepreg 2 also softens or melts and comes to have a decreased viscosity to start flowing and subsequently cures, thereby forming a second layer 6. In this manner, the printed wiring board 5 shown in FIG. 2 is manufactured.

The printed wiring board 5 includes the insulating substrate 10, the conductor 9, and the insulating layer 8, which are stacked one on top of another in this order. If the laminate 12 includes the sheet of metal foil 14, then the printed wiring board 5 further includes the sheet of metal foil 14 stacked on the insulating layer 8. Conductor wiring may be formed by patterning the sheet of metal foil 14 by etching process, for example. In that case, a printed wiring board 5 including the conductor wiring laid on top of the insulating layer 8 is obtained. If the electronic components 13 are mounted on the core member 11, then the printed wiring board 5 also includes the electronic components 13. The insulating layer 8 includes the second layer 6 as a cured product of the prepreg 2 and the first layer 7 as a cured product of the resin sheet 3. The conductor 9 is located opposite from the second layer 6 with respect to the first layer 7. In this embodiment, the conductor 9 and the electronic components 13 are embedded in the first layer 7.

Manufacturing the printed wiring board 5 in this manner enables embedding the conductor 9 in the insulating layer 8 by causing the resin sheet 3 that has softened or melted to flow and reduces the chances of the conductor 9 in the insulating layer 8 to come into contact with the base member 4 in the prepreg 2, thus making it easier to increase the reliability when the printed wiring board 5 is heated. In addition, in the insulating layer 8, the base member 4 is not included in the first layer 7 but is included in the second layer 6, thus enabling reducing the number of base members 4 to use and making it easier to reduce the thickness of the insulating layer 8.

The condition for hot-pressing the laminate 12 may be set appropriately according to the respective chemical makeups of the compositions (X1) and (X2), for example, but may include a heating temperature equal to or higher than 150° C. and equal to or lower than 250° C., a pressing pressure equal to or higher than 0.5 MPa and equal to or lower than 5 MPa, and a process time equal to or longer than 60 minutes and equal to or shorter than 120 minutes, for example.

As described above, a melt viscosity $\eta_1$ of the resin sheet 3 is equal to or greater than 10 Pa·s and equal to or less than 2000 Pa·s when measured using a Koka flow tester under a measuring condition including 130° C. and 1 MPa and a melt viscosity $\eta_2$ of the resin sheet 3 is equal to or greater than 6 Pa·s and equal to or less than 1200 Pa·s when measured using a Koka flow tester under a measuring condition including 130° C. and 4 MPa. Thus, making the melt viscosity $\eta_1$ at 1 MPa equal to or greater than 10 Pa·s and making the melt viscosity $\eta_2$ at 4 MPa equal to or greater than 6 Pa·s reduces the chances of leaving unfilled gaps in the first layer 7 or producing air bubbles in the first layer 7. This contributes to increasing the reliability of the printed wiring board 5. In addition, making the melt viscosity $\eta_1$ at 1 MPa equal to or less than 2000 Pa·s and making the melt viscosity $\eta_2$ at 4 MPa equal to or less than 1200 Pa·s reduces the chances of the resin flowing out while the first layer 7 is being formed. This may reduce a dispersion in the thickness of the insulating layer 8 and also reduce the chances of causing a failure in a long-term insulation reliability test by preventing the conductor 9 from coming into contact with the base member 4 in the prepreg 2. Specifically, arranging the conductor 9 too close to the base member 4 in the prepreg 2 would make it easier for ions to move along the base member 4, thus possibly causing ion migration. In contrast, interposing the first layer 7 between the conductor 9 and the prepreg 2 reduces the chances of causing ion migration. A specific exemplary method for measuring the melt viscosity will be described later in the "Examples" section.

The melt viscosity $\eta_2$ under the measuring condition including 130° C. and 4 MPa is presumably one of the factors that determine the flowability of the resin sheet 3 particularly while the resin sheet 3 is flowing following the conductor 9, i.e., the fillability thereof, in particular. During the molding process, a relatively high pressure is applied to a portion, surrounding the conductor 9, of the resin sheet 3. However, setting the melt viscosity $\eta_2$ that falls within this range would increase the flowability of that portion and eventually improve the fillability. On the other hand, the melt viscosity $\eta_1$ under the measuring condition including 130° C. and 1 MPa is presumably one of the factors that determine how smoothly the resin may flow out of the resin sheet 3, i.e., the thickness accuracy of the insulating layer 8. During the molding process, a relatively low pressure is applied to, for example, an end portion of the resin sheet 3. However, setting the melt viscosity $\eta_1$ that falls within this range would reduce the chances of causing the resin to flow excessively in that portion and thereby making it much less likely for the resin in the resin sheet 3 to flow out.

The melt viscosity $\eta_1$ under the measuring condition including 130° C. and 1 MPa is more preferably equal to or greater than 30 Pa·s and even more preferably equal to or greater than 50 Pa·s. Also, this melt viscosity $\eta_1$ is more preferably equal to or less than 1000 Pa·s and even more preferably equal to or less than 500 Pa·s. The melt viscosity $\eta_2$ under the measuring condition including 130° C. and 4 MPa is more preferably equal to or greater than 10 Pa·s and even more preferably equal to or greater than 20 Pa·s. Also, this melt viscosity $\eta_2$ is more preferably equal to or less than 600 Pa·s and even more preferably equal to or less than 300 Pa·s.

The resin sheet 3 preferably has a thixotropic index (TI) equal to or greater than 1.1. This particularly significantly reduce the chances of the resin flowing out while the first layer 7 is being formed. The thixotropic index is defined to be the ratio $(\eta_1/\eta_2)$ of the melt viscosity $\eta_1$ under the measuring condition including 130° C. and 1 MPa to the melt viscosity $\eta_2$ under the measuring condition including 130° C. and 4 MPa. Also, this thixotropic index is preferably equal to or less than 15. This would improve the fillability of the insulating layer 8 particularly significantly. The thixotropic index is more preferably equal to or greater than 1.2 and equal to or less than 8.0 and particularly preferably equal to or greater than 1.3 and equal to or less than 4.0.

The resin flowability of the resin sheet 3 as measured by Glynis method under a measuring condition including 130° C. and 0.5 MPa is preferably equal to or lower than 40%. This would further reduce the outflow of the resin while the first layer 7 is being formed out of the resin sheet 3, further improve the thickness accuracy of the insulating layer 8, and further reduce the chances of the conductor 9 coming into contact with the base member 4 in the prepreg 2. The resin flowability is more preferably equal to or less than 35% and even more preferably equal to or less than 30%. A specific exemplary method for measuring the resin flowability will be described later in the "Examples" section.

As described above, a melt viscosity of the uncured product or semi-cured product of the composition (X2) of the prepreg 2 is equal to or greater than 500 Pa·s and equal to or less than 6000 Pa·s when measured using a Koka flow tester under a measuring condition including 130° C. and 4 MPa. This makes it easier to further increase the thickness accuracy of the insulating layer 8 and further reduces the chances of the conductor 9 coming into contact with the base member 4 in the prepreg 2. This is presumably because reducing an excessive flow of the prepreg 2 while the second layer 6 is being formed out of the prepreg 2 would enable reducing the excessive flow of the resin sheet 3 due to the flow of the prepreg 2. A specific exemplary method for measuring the melt viscosity will be described later in the "Examples" section.

This melt viscosity is more preferably equal to or greater than 700 Pa·s and even more preferably equal to or greater than 1000 Pa·s. Also, this melt viscosity is more preferably equal to or less than 5000 Pa·s and even more preferably equal to or less than 4000 Pa·s.

The melt viscosity of the prepreg 2 under the measuring condition including 130° C. and 4 MPa is preferably higher than the melt viscosity of the resin sheet 3 under the measuring condition including 130° C. and 4 MPa. In particular, the melt viscosity of the prepreg 2 is preferably equal to or greater than 2000 Pa·s.

The prepreg 2 and the resin sheet 3 will be described in further detail.

As described above, the resin sheet 3 is an uncured product or semi-cured product of the composition (X1). Any material may be used as the composition (X1) without limitation as long as the material may be used to form the insulating layer 8 of the printed wiring board 5.

The composition (X1) contains a thermosetting resin. As used herein, the thermosetting resin may include at least one selected from the group consisting of a monomer, an oligomer, and a prepolymer, all of which have thermosetting properties. The thermosetting resin contains at least one selected from the group consisting of, for example, an epoxy resin, a polyimide resin, a phenolic resin, a bismaleimide triazine resin, and a thermosetting polyphenylene ether resin. The epoxy resin contains at least one component selected from the group consisting of, for example, bisphenol A epoxy resins, bisphenol F epoxy resins, cresol-novolac epoxy resins, bisphenol A novolac epoxy resins, bisphenol F novolac epoxy resins, naphthalene epoxy resins, biphenyl epoxy resins, dicyclopentadiene epoxy resins, and polyfunctional epoxy resins. The epoxy equivalent of the epoxy resin is preferably equal to or greater than 120 g/eq and equal to or less than 800 g/eq and more preferably equal to or greater than 170 g/eq and equal to or less than 600 g/eq. Note that these are only exemplary components that may be included in the thermosetting resin and should not be construed as limiting.

The composition (X1) may further contain an appropriate additive selected from the group consisting of a curing agent, a curing accelerator, a flame retardant, a rubber component, and an inorganic filler. The composition (X1) may further contain a solvent.

The curing agent contains at least one selected from the group consisting of, for example, diamine-based curing agents, bifunctional or higher-functional phenolic curing agents, acid anhydride-based curing agents, dicyandiamide, and low-molecular weight polyphenylene ether compounds. The bifunctional or higher-functional phenolic curing agents contain, for example, bisphenol A novolac phenolic resin. The diamine-based curing agents contain, for example, at least one selected from the group consisting of primary amines and secondary amines. The functional group equivalent of the curing agent is preferably equal to or greater than 20 g/eq and equal to or less than 500 g/eq.

The curing accelerator contains at least one selected from the group consisting of, for example, imidazole compounds, tertiary amine compounds, organic phosphine compounds, and metal soaps. The imidazole compounds contain, for example, 2-ethyl-4-methyl imidazole (2E4MZ).

The flame retardant contains at least one selected from the group consisting of, for example, halogen-based flame retardants and non-halogen-based flame retardants. The halogen-based flame retardants contain, for example, a bromine-containing compound. The non-halogen-based flame retardants contain at least one selected from the group consisting of, for example, phosphorus-containing compounds and nitrogen-containing compounds.

The rubber component contains, for example, elastomer fine particles. The elastomer fine particles may have, for example, a core-shell structure including a core layer and a shell layer and contain core-shell fine particles in which the shell layer is compatible with the epoxy resin. The polymer forming the shell layer contains, for example, at least one selected from the group consisting of polymethyl methacrylate and polystyrene. The polymer forming the core layer contains at least one selected from the group consisting of, for example, an acrylic polymer, a silicone polymer, a butadiene polymer, and an isoprene polymer.

The inorganic filler contains at least one selected from the group consisting of, for example, silica, aluminum hydroxide, magnesium hydroxide, aluminum silicate, magnesium silicate, talc, clay, mica, and molybdenum compounds. The silica includes at least one selected from the group consisting of, for example, spherical silica and crushed silica. The molybdenum compound includes, for example, molybdenum trioxide. The content of the inorganic filler is preferably equal to or greater than 20 parts by mass and equal to or less than 1400 parts by mass with respect to 100 parts by mass in total of the thermosetting resin and the curing agent.

The solvent contains at least one selected from the group consisting of, for example, an appropriate organic solvent and water. The organic solvent contains, for example, at least one selected from the group consisting of benzene, toluene, N, N-dimethylformamide (DMF), acetone, methyl ethyl ketone, methanol, ethanol, and cellosolves.

Note that these are only exemplary components of the composition (X1) and should not be construed as limiting.

For example, the composition (X1) may contain a phenoxy resin. The phenoxy resin imparts flexibility to the prepreg 2 formed out of the composition (X1) and reduces the chances of causing powdering.

When the resin sheet 3 is formed, the composition (X1) is molded into a sheet shape by, for example, an application method. Examples of the application method include a dipping method, a spray method, a spin coating method, a roll coating method, a curtain coating method, and a screen-printing method. Subsequently, the resin sheet 3 is formed by heating and thereby drying or semi-curing the composition (X1).

The resin sheet 3 is allowed to have such melt viscosity and resin flowability that fall within the ranges described above by appropriately setting the types of the components that form the composition (X1) and the respective contents thereof and the heating condition of the composition (X1) while the resin sheet 3 is being formed. The resin sheet 3 is allowed to have a decreased melt viscosity and an increased resin flowability by, for example, adding a low-viscosity component to the composition (X1), increasing the content of the low-viscosity component in the composition (X1), lowering the heating temperature, and/or shortening the heating duration. In addition, the melt viscosity under the measuring condition including 130° C. and 1 MPa and the melt viscosity under the measuring condition including 130° C. and 4 MPa may be adjusted by changing the type, particle size, and content of the inorganic filler in the composition (X1).

As described above, the prepreg 2 includes the base member 4 and an uncured product or semi-cured product of the composition (X2) impregnated into the base member 4.

The base member 4 may be, for example, a piece of inorganic fiber woven fabric, inorganic fiber non-woven fabric, organic fiber woven fabric, or organic fiber non-woven fabric. The inorganic fiber may be, for example, a glass fiber or a fiber of an inorganic material other than glass. Examples of the glass as a constituent material for the glass fiber include E glass, D glass, S glass, NE glass, T glass, and quartz. Examples of the organic fiber include an aramid fiber, a poly(paraphenylenebenzobisoxazole) (PBO) fiber, a poly(benzoimidazole) (PBI) fiber, a poly(tetrafluoroethylene) (PTFE) fiber, a poly(paraphenylenebenzobisthiazole) (PBZT) fiber, and a fully aromatic polyester fiber.

Any material may be used as the composition (X2) without limitation as long as the material may be used to form the insulating layer 8 of the printed wiring board 5.

The composition (X2) contains a thermosetting resin. The thermosetting resin contains at least one selected from the group consisting of, for example, an epoxy resin, a polyimide resin, a phenolic resin, a bismaleimide triazine resin, and a thermosetting polyphenylene ether resin. The epoxy resin contains at least one component selected from the group consisting of, for example, bisphenol A epoxy resins, bisphenol F epoxy resins, cresol-novolac epoxy resins, bisphenol A novolac epoxy resins, bisphenol F novolac epoxy resins, naphthalene epoxy resins, biphenyl epoxy resins, dicyclopentadiene epoxy resins, and polyfunctional epoxy resins. The epoxy equivalent of the epoxy resin is preferably equal to or greater than 120 g/eq and equal to or less than 800 g/eq and more preferably equal to or greater than 170 g/eq and equal to or less than 600 g/eq. Note that these are only exemplary components that may be included in the thermosetting resin and should not be construed as limiting.

The composition (X2) may further contain an appropriate additive selected from the group consisting of a curing agent, a curing accelerator, a flame retardant, and a rubber component. The composition (X2) may further contain a solvent.

The curing agent contains at least one selected from the group consisting of, for example, diamine-based curing agents, bifunctional or higher-functional phenolic curing agents, acid anhydride-based curing agents, dicyandiamide, and low-molecular weight polyphenylene ether compounds. The bifunctional or higher-functional phenolic curing agents contain, for example, bisphenol A novolac phenolic resin. The diamine-based curing agents contain, for example, at least one selected from the group consisting of primary amines and secondary amines. The functional group equivalent of the curing agent is preferably equal to or greater than 20 g/eq and equal to or less than 500 g/eq.

The curing accelerator contains at least one selected from the group consisting of, for example, imidazole compounds, tertiary amine compounds, organic phosphine compounds, and metal soaps. The imidazole compounds contain, for example, 2-ethyl-4-methyl imidazole (2E4MZ).

The flame retardant contains at least one selected from the group consisting of, for example, halogen-based flame retardants and non-halogen-based flame retardants. The halogen-based flame retardants contain, for example, a bromine-containing compound. The non-halogen-based flame retardants contain at least one selected from the group consisting of, for example, phosphorus-containing compounds and nitrogen-containing compounds.

The rubber component contains, for example, elastomer fine particles. The elastomer fine particles may have, for example, a core-shell structure including a core layer and a shell layer and contain core-shell fine particles in which the shell layer is compatible with the epoxy resin. The polymer forming the shell layer contains, for example, at least one selected from the group consisting of polymethyl methacrylate and polystyrene. The polymer forming the core layer contains at least one selected from the group consisting of, for example, an acrylic polymer, a silicone polymer, a butadiene polymer, and an isoprene polymer.

The solvent contains at least one selected from the group consisting of, for example, an appropriate organic solvent and water. The organic solvent contains, for example, at least one selected from the group consisting of benzene, toluene, N, N-dimethylformamide (DMF), acetone, methyl ethyl ketone, methanol, ethanol, and cellosolves.

Note that these are only exemplary components of the composition (X2) and should not be construed as limiting.

For example, the composition (X2) may contain a phenoxy resin. The phenoxy resin imparts flexibility to the resin sheet 3 formed out of the composition (X2) and reduces the chances of causing powdering.

Optionally, the composition (X2) may contain an inorganic filler. If the composition (X2) contains an inorganic filler, then the content of the inorganic filler is appropriately adjusted as far as the advantages of this embodiment are not impaired.

The prepreg 2 is formed by impregnating the composition (X2) into the base member 4 and then heating the composition (X2) and thereby either drying the composition (X2) or turning the composition (X2) into a semi-cured product. The condition for heating the composition (X2) may be adjusted appropriately according to the chemical makeup of the composition (X2) and the physical properties to be imparted to the prepreg 2.

The uncured product or semi-cured product of the composition (X2) in the prepreg 2 is allowed to have the melt viscosity falling within the range defined above by appropriately setting, for example, the types and respective contents of the components that form the composition (X2) and the condition for heating the composition (X2) while the prepreg 2 is being formed. The melt viscosity of the uncured product or semi-cured product of the composition (X2) may be adjusted by, for example, adding a low-viscosity component to the composition (X2), increasing the content of the low-viscosity component in the composition (X2), lowering the heating temperature, and/or shortening the heating duration.

An insulating resin member 1, including the resin sheet 3 and the prepreg 2 stacked on the resin sheet 3, may be formed by stacking the prepreg 2 on the resin sheet 3 and then hot-pressing the stack.

As described above, the insulating layer 8 may be formed out of the resin sheet 3 and the prepreg 2 and a printed wiring board 5 including the insulating layer 8 may be manufactured.

The conductor 9 to be embedded in the insulating layer 8 when the printed wiring board 5 is manufactured, i.e., the conductor 9 of the core member 11, may have a thickness equal to or greater than 70 μm and equal to or less than 500 μm, for example. Even though the conductor 9 is relatively thick, this embodiment still makes it easier to embed the conductor 9 in the insulating layer 8 and reduces the chances of causing a decline in moldability. In addition, if the conductor 9 is thick enough, then the amount of electric current allowed to flow through the conductor 9 may be increased accordingly. This enables applying the printed wiring board 5 to, for example, industrial equipment and onboard equipment which are required to allow a large amount of current to flow therethrough. The thickness of the conductor 9 is more preferably equal to or greater than 100 μm and equal to or less than 450 μm, and even more preferably equal to or greater than 130 μm and equal to or less than 420 μm. Note that these thickness ranges of the conductor 9 are only examples and should not be construed as limiting.

If the core member 11 includes electronic components 13 mounted thereon, then the thickness of the electronic components 13 may be, for example, equal to or greater than 100 μm and equal to or less than 500 μm. As used herein, the thickness of the electronic components 13 refers to the maximum height of the electronic components 13 as measured from the surface of the insulating substrate 10 of the core member 11. Even if the electronic components 13 have a thickness falling within such a range, this embodiment still makes it easier to embed the electronic components 13 in the insulating layer 8 and reduces the chances of causing a decline in moldability. The thickness of the electronic components 13 is more preferably equal to or greater than 100 μm and equal to or less than 450 μm and even more preferably equal to or greater than 130 μm and equal to or less than 420 μm. Note that these thickness ranges of the electronic components 13 are only examples and should not be construed as limiting.

EXAMPLES

Next, more specific examples of this embodiment will be presented. Note that the examples to be described below are only examples of this embodiment and should not be construed as limiting.

1. Resin Sheet
(1) Formation of Resin Sheet

A composition was prepared by mixing respective components shown in the "chemical makeup" column of the resin sheet in Tables 1 and 2. The following are the details of those components shown in Tables 1 and 2:

Brominated epoxy resin: brominated bisphenol A epoxy resin, product name "EPICLON 1121N-80M" manufactured by DIC Corporation;
Bisphenol A epoxy resin: product name "1051-75M" manufactured by DIC Corporation;
Cresol-novolac epoxy resin: product name "EPICLON N-690-75M" manufactured by DIC Corporation;
DICY: dicyandiamide;
2E4MZ: 2-ethyl-4-methylimidazole;
Phenoxy resin: product number "YP50EK35" manufactured by NIPPON STEEL Chemical & Materials Co., Ltd.; and
Solvent: a mixed solvent including methyl ethyl ketone (MEK), propylene glycol monomethyl ether (PGME), and N, N-dimethylformamide (DMF).

The composition was applied onto a PET film and heated to the heating temperature and for the heating duration shown in the "Heating condition" column in Tables 1 and 2. In this manner, a resin sheet having any of the thicknesses shown in Tables 1 and 2 was obtained.

(2) Property Tests on Resin Sheet

The resin sheet was subjected to the following property tests. The results are summarized in Tables 1 and 2.

(2-1) Film Property

The resin sheet was subjected to a bend test by cylindrical mandrel method using a bent tester. A resin sheet in which no cracks were recognized when the mandrel had a diameter of 10 mm was graded "A." A resin sheet in which some cracks were recognized when the mandrel had a diameter of 10 mm but in which no cracks were recognized when the mandrel had a diameter of 20 mm was graded "B." A resin sheet in which some cracks were recognized when the mandrel had a diameter of 20 mm was graded "C."

(2-2) Melt Viscosity and TI

A sample was obtained by peeling off the resin sheet from a PET film. The melt viscosity $\eta_1$ of this sample was measured using a Koka flow tester (model number "FT-500D/100D" manufactured by Shimadzu Corporation) under a measuring condition including a temperature of 130° C. and a pressure of 1 MPa.

In the same way, the melt viscosity $\eta_2$ of the sample was also measured under a measuring condition including a temperature of 130° C. and a pressure of 4 MPa.

In addition, based on the measurement results of these melt viscosities, a thixotropic index ($\eta_1/\eta_2$) was also calculated.

(2-3) Resin Flowability

The resin sheet was peeled off from the PET film and was cut off into a test piece having dimensions of 100 mm×100 mm.

The test piece was sandwiched between two mold release films. Then, these were put into the gap between two heating platens and hot-pressed under the condition including 130° C., 0.5 MPa, and 300 seconds.

The weight (W1) of the test piece before being hot-pressed was measured. In addition, a sample with a diameter of 80 mm was punched out of the test piece that had been hot-pressed. The weight (W2) of this sample was measured. Based on this result, the resin flowability was calculated by the equation: resin flowability=(W1−2×W2)/W1×100(%).

2. Prepreg
(1) Formation of Prepreg

A composition was prepared by mixing respective components shown in the "Chemical makeup" column of the prepreg in Tables 1 and 2. The following are the details of those components shown in Tables 1 and 2:

Brominated epoxy resin: brominated bisphenol A epoxy resin, product name "EPICLON 1121N-80M" manufactured by DIC Corporation;
Cresol-novolac epoxy resin: product name "EPICLON N-690-75M" manufactured by DIC Corporation;
DICY: dicyandiamide;
2E4MZ: 2-ethyl-4-methylimidazole;
SO-25R: spherical silica, product name "SO-25R" manufactured by Admatechs;
R974: fumed silica, product name "R974" manufactured by Nippon Aerosil Co., Ltd.;
Silane coupling agent: 3-glycidoxypropyltrimethoxysilane, product number "KBM-403" manufactured by Shin-Etsu Chemical Co., Ltd.;
Phenoxy resin: product number "YP50EK35" manufactured by NIPPON STEEL Chemical & Materials Co., Ltd.
Acrylic acid ester polymer: product name "Teisan Resin SG-P3" manufactured by Nagase ChemteX Corporation; and
Solvent: a mixed solvent including methyl ethyl ketone (MEK), propylene glycol monomethyl ether (PGME), and N, N-dimethylformamide (DMF).

A piece of glass cloth (#1080) of E glass was provided as a base member, impregnated with the composition, and then the composition was heated to the heating temperature and for the heating duration shown in the "Heating condition" column in Tables 1 and 2. In this manner, a prepreg having the resin content and thickness shown in Tables 1 and 2 was obtained.

(2) Melt Viscosity

A sample was obtained by removing he base member from the prepreg. The melt viscosity of this sample was measured using a Koka flow tester (model number "FT-500D/100D" manufactured by Shimadzu Corporation) under a measuring condition including a temperature of 130° C. and a pressure of 4 MPa. The results are summarized in Tables 1 and 2.

3. Evaluation Tests
(1) Fillability

A core member, including an insulating substrate and conductor wiring provided on each of the two surfaces of the insulating substrate, was provided. The insulating substrate was an epoxy resin substrate including glass cloth as its base member. Each conductor wiring was made of copper and had a residual copper ratio of 60%. In addition, a core member on which an electronic component had been mounted was also used. As for a core member on which no electronic components were mounted, the thickness of the conductor of the core member is shown in the "Thickness of conductor or electronic component of core member" column in Tables 1 and 2. As for a core member on which an electronic component was mounted, the thickness of the electronic component is shown in the "Thickness of conductor or electronic component of core member" column in Tables 1 and 2.

On each of the two surfaces of the core member, a single or a plurality of resin sheets, a prepreg, and a sheet of copper foil with a thickness of 35 μm were stacked one on top of another in this order. In other words, a sheet of copper foil, a prepreg, a single or a plurality of resin sheets, the core member, a single or a plurality of resin sheets, another prepreg, and another sheet of copper foil were stacked one on top of another in this order. The number of the resin sheets is as shown in Tables 1 and 2. In this manner, a laminate was obtained. Then, a printed wiring board was formed by hot-pressing the laminate under the condition including 200° C., 22 MPa, and 60 minutes.

This printed wiring board was cut off. A cross section thus exposed was polished and then observed to see if any air gap was left between the insulating layer and the conductor wiring or the electronic component.

A printed wiring board, of which the conductor wiring had a residual copper ratio of 80%, was also evaluated in the same way.

A printed wiring board in which air gaps were recognized neither when the residual copper ratio was 60% nor when the residual copper ratio was 80% was graded "A." A printed wiring board in which some air gaps were recognized when the residual copper ratio was 60% but no air gaps were recognized when the residual copper ratio was 80% was graded "B." A printed wiring board in which air gaps were recognized both when the residual copper ratio was 60% and when the residual copper ratio was 80% was graded "C."

(2) Thickness Accuracy

A printed wiring board was obtained under the same condition (except that each conductor wiring had a residual copper ratio of 60% only) as in the "(1) Fillability" section described above.

The thicknesses of the printed wiring board were measured with a micrometer at five points on the printed wiring board. If the difference between the maximum and minimum values of the five measured values thus obtained was equal to or less than 10% of a theoretical thickness value of the printed wiring board, then such a printed wiring board was graded "A." If the difference between the maximum and minimum values was greater than 10% and equal to or less than 20% of the theoretical thickness value of the printed wiring board, then such a printed wiring board was graded "B." If the difference between the maximum and minimum values was greater than 20% of the theoretical thickness value of the printed wiring board, then such a printed wiring board was graded "C."

TABLE 1

|  |  |  |  | Examples | | | | | | |
|---|---|---|---|---|---|---|---|---|---|---|
|  |  |  |  | 1 | 2 | 3 | 4 | 5 | 6 | 7 |
| Resin sheet | Chemical makeup/ parts by mass | Thermosetting resin | Brominated epoxy resin | 70 | 70 | 70 | 70 | 70 | 70 | 70 |
|  |  |  | Bisphenol A epoxy resin | 0 | 0 | 0 | 0 | 0 | 0 | 0 |
|  |  |  | Cresol-novolac epoxy resin | 20 | 20 | 20 | 20 | 20 | 20 | 20 |
|  |  | Curing agent | DICY | 2.4 | 2.4 | 2.4 | 2.4 | 2.4 | 2.4 | 2.4 |
|  |  | Accelerator | 2E4MZ | 0.1 | 0.1 | 0.1 | 0.1 | 0.1 | 0.1 | 0.1 |
|  |  | Filler | SO-25R | 200 | 200 | 200 | 200 | 100 | 200 | 200 |
|  |  |  | R974 | 10 | 10 | 10 | 10 | 0 | 10 | 10 |
|  |  | Additive | Silane coupling agent | 1 | 1 | 1 | 1 | 1 | 1 | 1 |
|  |  |  | Phenoxy resin | 10 | 10 | 0 | 10 | 10 | 10 | 10 |
|  |  |  | Acrylic acid ester polymer | 0 | 0 | 10 | 0 | 0 | 0 | 0 |
|  |  | Solvent | MEK, DMF, PGME | 200 | 200 | 200 | 200 | 130 | 200 | 200 |
|  | Heating Condition | Heating temperature (° C.) |  | 150 | 150 | 150 | 150 | 150 | 150 | 150 |
|  |  | Heating duration (min) |  | 5 | 5 | 5 | 5 | 5 | 3.5 | 5 |
|  | Thickness (μm) |  |  | 100 | 100 | 100 | 100 | 100 | 100 | 100 |
|  | Number of sheets |  |  | 1 | 1 | 1 | 3 | 1 | 1 | 1 |
|  | Properties | Film property |  | A | A | A | A | A | A | A |
|  |  | Melt viscosity (Pa · s) | 130° C., 1 MPa | 150 | 150 | 400 | 150 | 40 | 15 | 150 |
|  |  |  | 130° C., 4 MPa | 90 | 90 | 240 | 90 | 30 | 9 | 90 |
|  |  | TI |  | 1.7 | 1.7 | 1.7 | 1.7 | 1.3 | 1.7 | 1.7 |
|  |  | Resin flowability |  | 8 | 8 | 6 | 8 | 50 | 8 | 8 |
| Prepreg | Chemical makeup/ parts by mass | Thermosetting resin | Brominated epoxy resin | 70 | 70 | 70 | 70 | 70 | 70 | 70 |
|  |  |  | Cresol-novolac epoxy resin | 20 | 20 | 20 | 20 | 20 | 20 | 20 |
|  |  | Curing agent | DICY | 2.4 | 2.4 | 2.4 | 2.4 | 2.4 | 2.4 | 2.4 |
|  |  | Accelerator | 2E4MZ | 0.1 | 0.1 | 0.1 | 0.1 | 0.1 | 0.1 | 0.1 |
|  |  | Additive | Phenoxy resin | 10 | 10 | 10 | 10 | 10 | 10 | 10 |
|  |  | Solvent | MEK, DMF, PGME | 40 | 40 | 40 | 40 | 40 | 40 | 40 |

TABLE 1-continued

|  |  |  |  | Examples | | | | | | |
|---|---|---|---|---|---|---|---|---|---|---|
|  |  |  |  | 1 | 2 | 3 | 4 | 5 | 6 | 7 |
|  | Heating condition | Heating temperature (° C.) | | 150 | 150 | 150 | 150 | 150 | 150 | 150 |
|  |  | Heating duration (min) | | 10 | 11 | 9 | 10 | 10 | 13 | 3 |
|  | Resin content (mass %) | | | 70 | 70 | 70 | 70 | 70 | 70 | 70 |
|  | Thickness (μm) | | | 100 | 100 | 100 | 100 | 100 | 100 | 100 |
|  | Properties [melt viscosity (Pa · s)] 130° C., 4 MPa | | | 3000 | 5000 | 1000 | 3000 | 3000 | 10000 | 20 |
| Thickness (μm) of conductor or electronic component of core member | | | | 210 | 210 | 210 | 420 | 210 | 210 | 210 |
| Evaluation | Fillability | | | A | A | A | B | A | B | A |
|  | Thickness accuracy | | | A | A | A | A | B | A | B |

TABLE 2

|  |  |  |  | Examples | | | | | Comparative Examples | |
|---|---|---|---|---|---|---|---|---|---|---|
|  |  |  |  | 8 | 9 | 10 | 11 | 12 | 1 | 2 |
| Resin sheet | Chemical makeup/ parts by mass | Thermosetting resin | Brominated epoxy resin | 70 | 70 | 0 | 70 | 80 | 70 | 70 |
|  |  |  | Bisphenol A epoxy resin | 0 | 0 | 70 | 0 | 0 | 0 | 0 |
|  |  |  | Cresol-novolac epoxy resin | 20 | 20 | 20 | 20 | 20 | 20 | 20 |
|  |  | Curing agent | DICY | 2.4 | 2.4 | 2.4 | 2.4 | 2.6 | 2.4 | 2.4 |
|  |  | Accelerator | 2E4MZ | 0.1 | 0.1 | 0.1 | 0.1 | 0.1 | 0.1 | 0.1 |
|  |  | Filler | SO-25R | 200 | 250 | 200 | 200 | 200 | 200 | 200 |
|  |  |  | R974 | 10 | 10 | 10 | 20 | 10 | 10 | 10 |
|  |  | Additive | Silane coupling agent | 1 | 1 | 1 | 1 | 1 | 1 | 1 |
|  |  |  | Phenoxy resin | 10 | 10 | 10 | 10 | 0 | 10 | 10 |
|  |  |  | Acrylic acid ester polymer | 0 | 0 | 0 | 0 | 0 | 0 | 0 |
|  |  | Solvent | MEK, DMF, PGME | 200 | 200 | 200 | 200 | 200 | 200 | 200 |
|  | Heating condition | Heating temperature (° C.) | | 150 | 150 | 150 | 150 | 150 | 150 | 150 |
|  |  | Heating duration (min) | | 5 | 5 | 5 | 5 | 4 | 7 | 3 |
|  | Thickness (μm) | | | 100 | 100 | 100 | 100 | 100 | 100 | 100 |
|  | Number of sheets | | | 5 | 1 | 1 | 3 | 1 | 1 | 1 |
|  | Properties | Film property | | A | A | A | A | C | A | A |
|  |  | Melt viscosity (Pa · s) | 130° C., 1 MPa | 150 | 300 | 150 | 1500 | 50 | 3000 | 5 |
|  |  |  | 130° C., 4 MPa | 90 | 150 | 90 | 150 | 40 | 1800 | 3 |
|  |  | TI | | 1.7 | 2.0 | 1.7 | 10.0 | 1.3 | 1.7 | 1.7 |
|  |  | Resin flowability | | 8 | 6 | 8 | 3 | 12 | 0 | 60 |
| Prepreg | Chemical makeup/ parts by mass | Thermosetting resin | Brominated epoxy resin | 70 | 70 | 70 | 70 | 70 | 70 | 70 |
|  |  |  | Cresol-novolac epoxy resin | 20 | 20 | 20 | 20 | 20 | 20 | 20 |
|  |  | Curing agent | DICY | 2.4 | 2.4 | 2.4 | 2.4 | 2.4 | 2.4 | 2.4 |
|  |  | Accelerator | 2E4MZ | 0.1 | 0.1 | 0.1 | 0.1 | 0.1 | 0.1 | 0.1 |
|  |  | Additive | Phenoxy resin | 10 | 10 | 10 | 10 | 10 | 10 | 10 |
|  |  | Solvent | MEK, DMF, PGME | 40 | 40 | 40 | 40 | 40 | 40 | 40 |
|  | Heating condition | Heating temperature (° C.) | | 150 | 150 | 150 | 150 | 150 | 150 | 150 |
|  |  | Heating duration (min) | | 10 | 10 | 10 | 10 | 10 | 10 | 10 |
|  | Resin content (mass %) | | | 70 | 70 | 70 | 70 | 70 | 70 | 70 |
|  | Thickness (μm) | | | 100 | 100 | 100 | 100 | 100 | 100 | 100 |
|  | Properties [melt viscosity (Pa · s)] 130° C., 4 MPa | | | 3000 | 3000 | 3000 | 3000 | 3000 | 3000 | 3000 |
| Thickness (μm) of conductor or electronic component of core member | | | | 550 | 210 | 210 | 210 | 210 | 210 | 210 |
| Evaluation | Fillability | | | B | B | A | A | A | C | A |
|  | Thickness accuracy | | | A | A | A | A | B | A | C |

REFERENCE SIGNS LIST

1 Insulating Resin Member
2 Prepreg
3 Resin Sheet
4 Base Member
5 Printed Wiring Board
6 Second Layer
7 First Layer
8 Insulating Layer
9 Conductor
10 Insulating Substrate
11 Core Member
13 Electronic Component
14 Sheet of Metal Foil

The invention claimed is:

1. A resin sheet comprising an uncured product or semi-cured product of a thermosetting resin composition (X1),
a melt viscosity of the resin sheet being equal to or greater than 10 Pa·s and equal to or less than 2000 Pa·s when measured using a Koka flow tester under a measuring condition including 130° C. and 1 MPa and being equal to or greater than 6 Pa·s and equal to or less than 1200 Pa·s when measured using the Koka flow tester under a measuring condition including 130° C. and 4 MPa, and
a resin flowability of the resin sheet as measured by Glynis method under a measuring condition including 130° C. and 0.5 MPa being equal to or lower than 40%.

2. An insulating resin member comprising:
the resin sheet of claim 1; and
a prepreg stacked on the resin sheet,
the prepreg comprising: a base member; and an uncured product or semi-cured product of a thermosetting resin composition (X2) impregnated into the base member,
a melt viscosity of the uncured product or semi-cured product of the thermosetting resin composition (X2) being equal to or greater than 500 Pa·s and equal to or less than 6000 Pa·s when measured using the Koka flow tester under the measuring condition including 130° C. and 4 MPa.

3. A printed wiring board comprising:
a core member including an insulating substrate and a conductor laid on top of the insulating substrate; and
an insulating layer stacked on the core member and covering the conductor,
the insulating layer including: a first layer which is arranged in contact with the core member and is a cured product of a resin sheet; and a second layer which is stacked on the first layer and is a cured product of a prepreg,
the resin sheet comprising an uncured product or semi-cured product of a thermosetting resin composition (X1),
a melt viscosity of the resin sheet being equal to or greater than 10 Pa·s and equal to or less than 2000 Pa·s when measured using a Koka flow tester under a measuring condition including 130° C. and 1 MPa and being equal to or greater than 6 Pa·s and equal to or less than 1200 Pa·s when measured using the Koka flow tester under a measuring condition including 130° C. and 4 MPa,
the prepreg comprising: a base member; and an uncured product or semi-cured product of a thermosetting resin composition (X2) impregnated into the base member,
a melt viscosity of the uncured product or semi-cured product of the thermosetting resin composition (X2) being equal to or greater than 500 Pa·s and equal to or less than 6000 Pa·s when measured using the Koka flow tester under the measuring condition including 130° C. and 4 MPa.

4. The printed wiring board of claim 3, wherein
the conductor has a thickness equal to or greater than 70 μm and equal to or less than 500 μm.

5. The printed wiring board of claim 3, further comprising an electronic component mounted on the core member, wherein
the electronic component is embedded in the insulating layer.

6. The printed wiring board of claim 5, wherein
the electronic component has a thickness equal to or greater than 70 μm and equal to or less than 500 μm.

* * * * *